: US 10,408,545 B2
(45) Date of Patent: Sep. 10, 2019

(54) COOLING SYSTEM AND ELECTRONIC EQUIPMENT

(71) Applicant: NEC PLATFORMS, LTD., Kanagawa (JP)

(72) Inventors: Yasuhito Nakamura, Kanagawa (JP); Shunsuke Fujii, Kanagawa (JP)

(73) Assignee: NEC PLATFORMS, LTD., Kanagawa (JP)

( * ) Notice: Subject to any disclaimer, the term of this patent is extended or adjusted under 35 U.S.C. 154(b) by 400 days.

(21) Appl. No.: 15/105,950

(22) PCT Filed: Dec. 2, 2014

(86) PCT No.: PCT/JP2014/006021
§ 371 (c)(1),
(2) Date: Jun. 17, 2016

(87) PCT Pub. No.: WO2015/097992
PCT Pub. Date: Jul. 2, 2015

(65) Prior Publication Data
US 2016/0313069 A1  Oct. 27, 2016

(30) Foreign Application Priority Data

Dec. 25, 2013 (JP) .................................. 2013-267091

(51) Int. Cl.
*F28D 15/02* (2006.01)
*H05K 7/20* (2006.01)
(Continued)

(52) U.S. Cl.
CPC ..... *F28D 15/0266* (2013.01); *F28D 15/0208* (2013.01); *F28D 15/0241* (2013.01);
(Continued)

(58) Field of Classification Search
CPC ............. F28D 15/0266; F28D 15/0208; F28D 15/0241; F28D 15/06; F28D 2015/0216; H05K 7/20318
See application file for complete search history.

(56) References Cited

U.S. PATENT DOCUMENTS 6,257,324 B1 * 7/2001 Osakabe ............. F28D 15/0233
165/104.21
7,552,759 B2 * 6/2009 Liu ....................... F28D 15/043
126/635
(Continued)

FOREIGN PATENT DOCUMENTS

DE  102017110102 A1 * 11/2018 ........... F25D 21/002
FR      2725265 A1 *  4/1996 ............... F25D 3/06
(Continued)

OTHER PUBLICATIONS

Extended European Search Report for EP Application No. EP14873921.2 dated on Jun. 28, 2017.
(Continued)

*Primary Examiner* — Jon T. Schermerhorn, Jr.

(57) ABSTRACT

A cooling system includes a heat absorbing device which has a first pipe port and absorbs heat discharged from equipment by using refrigerant; a radiator which has a second pipe port placed higher than the first pipe port and cools the refrigerant; a first flexible pipe whose one end is connected with the first pipe port and whose another end is connected with the second pipe port and through which the refrigerant flows and which can bend freely; and a loading table having a surface which becomes higher in a vertical direction as approaching from one end of the surface to another end, and on which the first flexible pipe is placed so as to become higher in the vertical direction as approaching from a side of the first flexible pipe, which is connected with
(Continued)

the first pipe port, to a side of the first flexible pipe which is connected with the second pipe port.

8 Claims, 6 Drawing Sheets

(51) Int. Cl.
*F28D 15/06* (2006.01)
*G06F 1/20* (2006.01)

(52) U.S. Cl.
CPC ............... *F28D 15/06* (2013.01); *G06F 1/20* (2013.01); *H05K 7/20318* (2013.01); *H05K 7/20818* (2013.01); *F28D 2015/0216* (2013.01); *F28F 2265/12* (2013.01)

(56) References Cited

U.S. PATENT DOCUMENTS

| | | | | |
|---|---|---|---|---|
| 7,660,116 | B2* | 2/2010 | Claassen | G06F 1/20 165/80.4 |
| 7,950,244 | B2* | 5/2011 | Iyengar | H05K 7/20781 165/80.4 |
| 8,077,462 | B2 | 12/2011 | Barringer et al. | |
| 8,587,941 | B2* | 11/2013 | Julien-Roux | G06F 1/20 165/104.33 |
| 9,066,452 | B2* | 6/2015 | Julien-Roux | G06F 1/20 |
| 2004/0163798 | A1* | 8/2004 | Ghosh | F28D 15/0233 165/104.21 |
| 2009/0122488 | A1 | 5/2009 | Iyengar et al. | |
| 2009/0260384 | A1* | 10/2009 | Champion | H05K 7/20754 62/259.2 |
| 2010/0059201 | A1 | 3/2010 | Masto et al. | |
| 2011/0103009 | A1 | 5/2011 | Julien-Roux et al. | |
| 2011/0259573 | A1 | 10/2011 | Ezawa et al. | |
| 2013/0091881 | A1* | 4/2013 | Ito | H05K 7/20827 62/119 |
| 2016/0014933 | A1* | 1/2016 | Matsunaga | G06F 1/20 361/679.53 |
| 2016/0295749 | A1* | 10/2016 | Yoshikawa | G06F 1/20 |

FOREIGN PATENT DOCUMENTS

| | | | | |
|---|---|---|---|---|
| JP | H02-225892 | A | 9/1990 | |
| JP | 05126479 | A * | 5/1993 | .......... F28D 15/0208 |
| JP | H08-338567 | A | 12/1996 | |
| JP | H09-256612 | A | 9/1997 | |
| JP | H10-141549 | A | 5/1998 | |
| JP | H10-288281 | A | 10/1998 | |
| JP | 11-036425 | A | 2/1999 | |
| JP | 2002-134664 | A | 5/2002 | |
| JP | 2002-206880 | A | 7/2002 | |
| JP | 2002-295730 | A | 10/2002 | |
| JP | 2003-125509 | A | 4/2003 | |
| JP | 2004-172021 | A | 6/2004 | |
| JP | 2004-270751 | A | 9/2004 | |
| JP | 2005-156011 | A | 6/2005 | |
| JP | 2009-123212 | A | 6/2009 | |
| JP | 2009-134531 | A | 6/2009 | |
| JP | 2011-007502 | A | 1/2011 | |
| JP | 2011-038734 | A | 2/2011 | |
| JP | 2011-165707 | A | 8/2011 | |
| JP | 2011-247573 | A | 12/2011 | |
| JP | 2012-015376 | A | 1/2012 | |
| JP | 2017075737 | A * | 4/2017 | ............... H05K 7/20 |
| WO | 2011/122207 | A1 | 10/2011 | |
| WO | 2012/166086 | A1 | 12/2012 | |
| WO | WO-2016095589 | A1 * | 6/2016 | .............. F25D 11/00 |

OTHER PUBLICATIONS

Japanese Office Action for JP Application No. 2015-186330 dated Sep. 19, 2017 with English Translation.
International Search Report for PCT Application No. PCT/JP2014/006021, dated Feb. 24, 2015.
English translation of Written opinion for PCT Application No. PCT/JP2014/006021.
Japanese Office Action for JP Application No. 2013-267091 dated Oct. 7, 2014 with English Translation.
Japanese Office Action for JP Application No. 2013-267091 dated Jan. 20, 2015 with English Translation.
Japanese Office Action for JP Application No. 2013-267091 dated Jun. 23, 2015 English Translation.

* cited by examiner

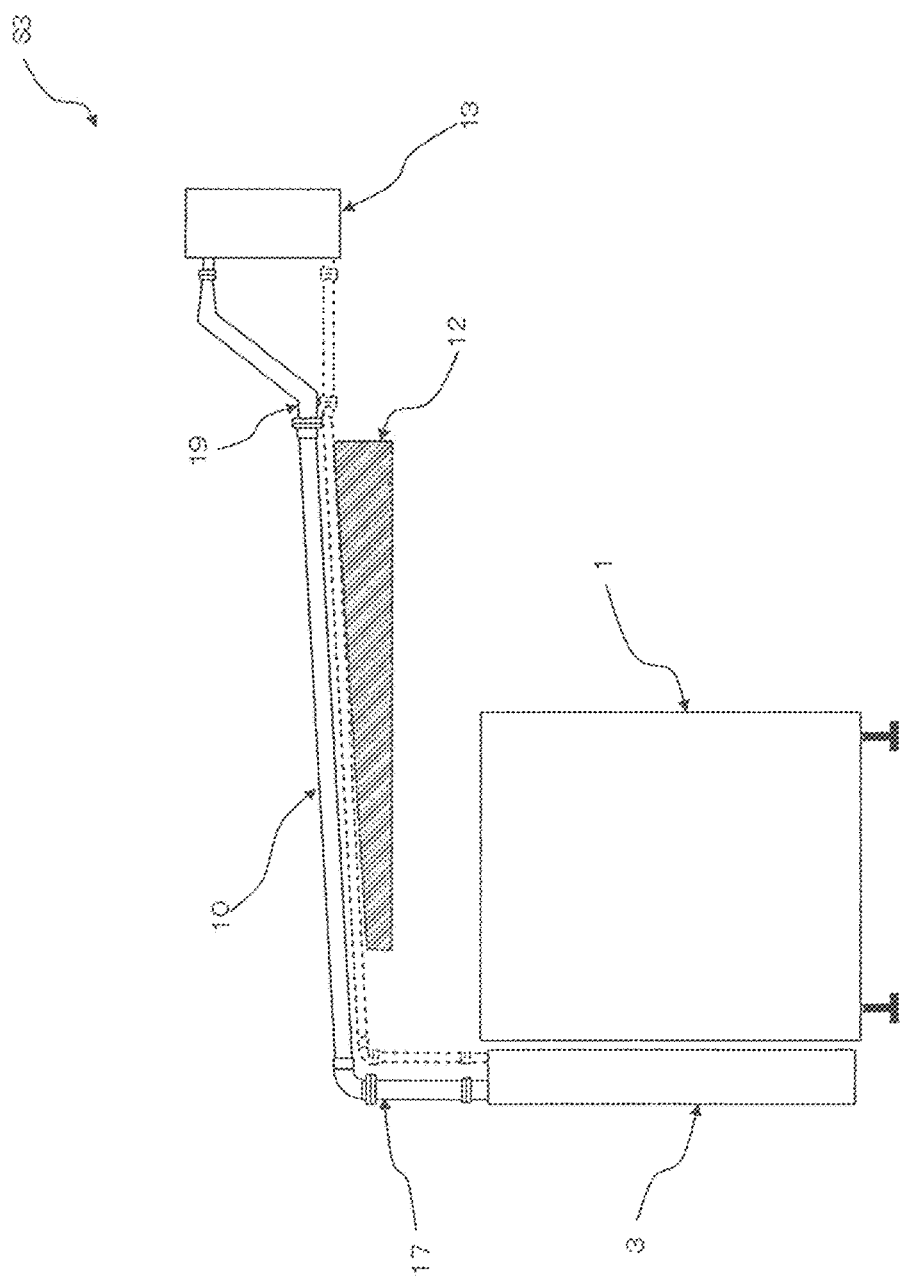

COOLING SYSTEM AND ELECTRONIC EQUIPMENT

This application is a National Stage Entry of PCT/JP2014/006021 filed on Dec. 2, 2014, which claims priority from Japanese Patent Application 2013-267091 filed on Dec. 25, 2013, the contents of all of which are incorporated herein by reference, in their entirety.

TECHNICAL FIELD

The present invention relates to an art for cooling equipment which generates heat, and particularly relates to a cooling system and electronic equipment.

BACKGROUND ART

In operating the equipment which generates heat such as a server or the like, it is required to effectively cool the equipment.

A cooling system described by PTL (Patent Literature) 1 absorbs heat discharged from a server by evaporating refrigerant liquid which flows in an evaporator. The cooling system discharges the heat absorbed by condensing heated refrigerant vapor in a cooling tower placed higher than the evaporator.

According to the cooling system which is described by PTL 1, it is possible to move the evaporator by using a flexible pipe as a part of pipe which connects the evaporator and the cooling tower.

CITATION LIST

Patent Literature

[PTL 1] Japanese Patent Application Laid-Open Publication No. 2011-165707

SUMMARY OF INVENTION

Technical Problem

According to the above-mentioned cooling system which is described by PTL 1, by arranging the cooling tower higher than the evaporator, it is possible to effectively convey the refrigerant which is vapor or liquid between the cooling tower and the evaporator. However, in the case that the pipe that serves as a refrigerant flow path has a reverse inclination portion, movement of the refrigerant at the reverse inclination portion is stagnated. As a result, a problem that cooling efficiency is degraded is caused. This includes, for example, a case that a part of flexible pipe has a shape of loop, like a flexible pipe described in FIG. 5 of PLT 1.

A main object of the present invention is to provide an art for solving the above-mentioned problem.

Solution to Problem

To achieve the above object, a cooling system according to the present invention includes a heat absorbing device which has a first pipe port and absorbs heat discharged from equipment by using refrigerant; a radiator which has a second pipe port placed higher than the first pipe port and cools the refrigerant; a first flexible pipe that is bendable and serves as a flow path of the refrigerant, the first flexible pipe being connected to the first pipe port at one end and the second pipe port at another end; and a loading table having a surface that rises in a vertical direction as a corresponding position onto the surface approaches from one end of the surface to another end, the surface supporting the first flexible pipe placed thereon in such a way that the first flexible pipe rises in the vertical direction as a corresponding position on the first flexible pipe approaches from a side connected to the first pipe port to a side connected to the second pipe port.

To achieve the above object, electronic equipment according to the present invention includes the above cooling system.

Advantageous Effects of Invention

According to the present invention, it is possible to prevent degradation of the cooling efficiency in the cooling system which uses the refrigerant.

BRIEF DESCRIPTION OF DRAWINGS

FIG. 6 is a side view showing structure of a cooling system according to a third exemplary embodiment of the present invention.

DESCRIPTION OF EMBODIMENTS

Next, an exemplary embodiment of the present invention will be described in detail with reference to drawings.

[First Exemplary Embodiment]

Figure 1:
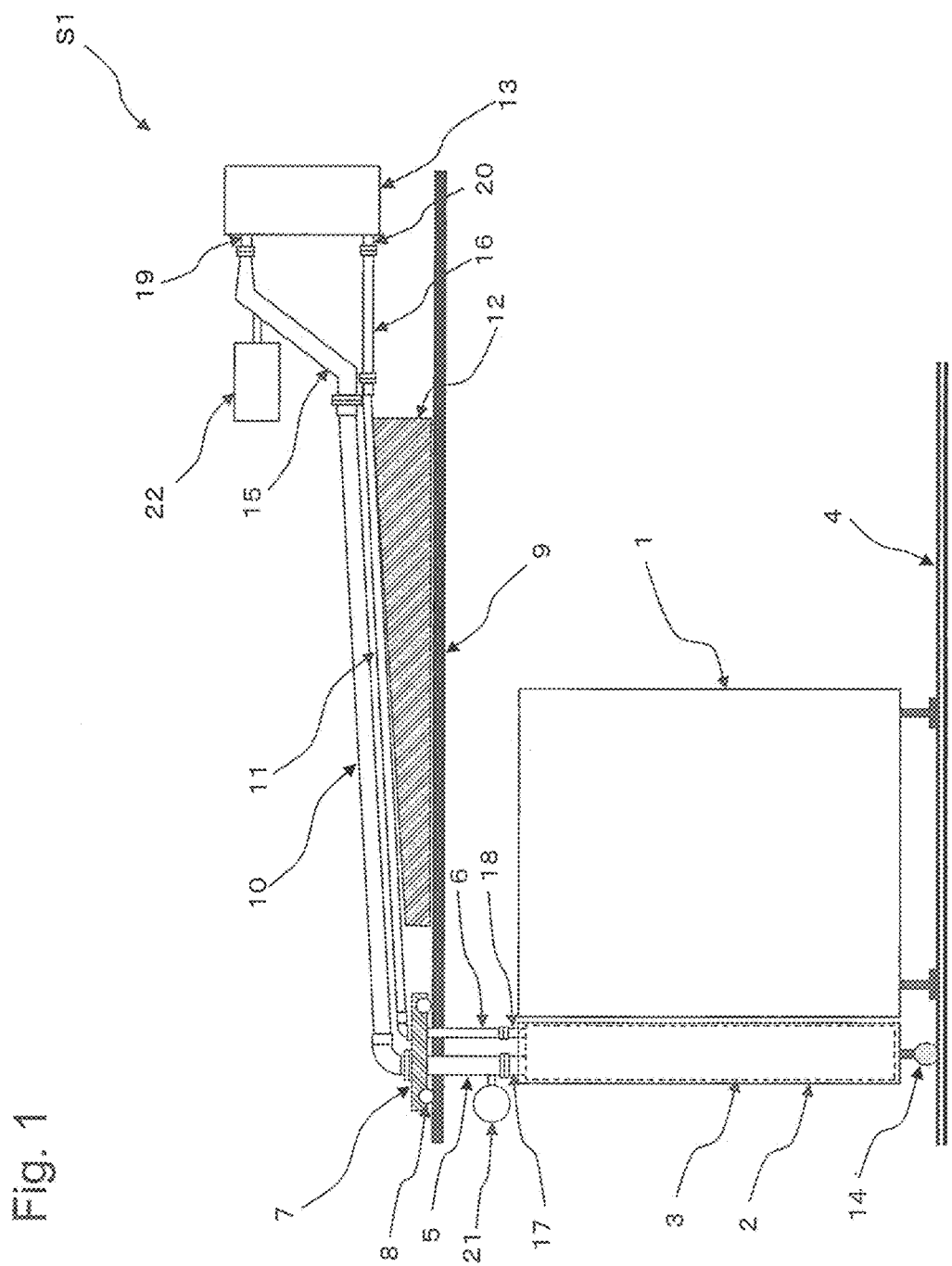
FIG. 1 is a side view showing structure of a cooling system according to a first exemplary embodiment of the present invention.
Figure 2:
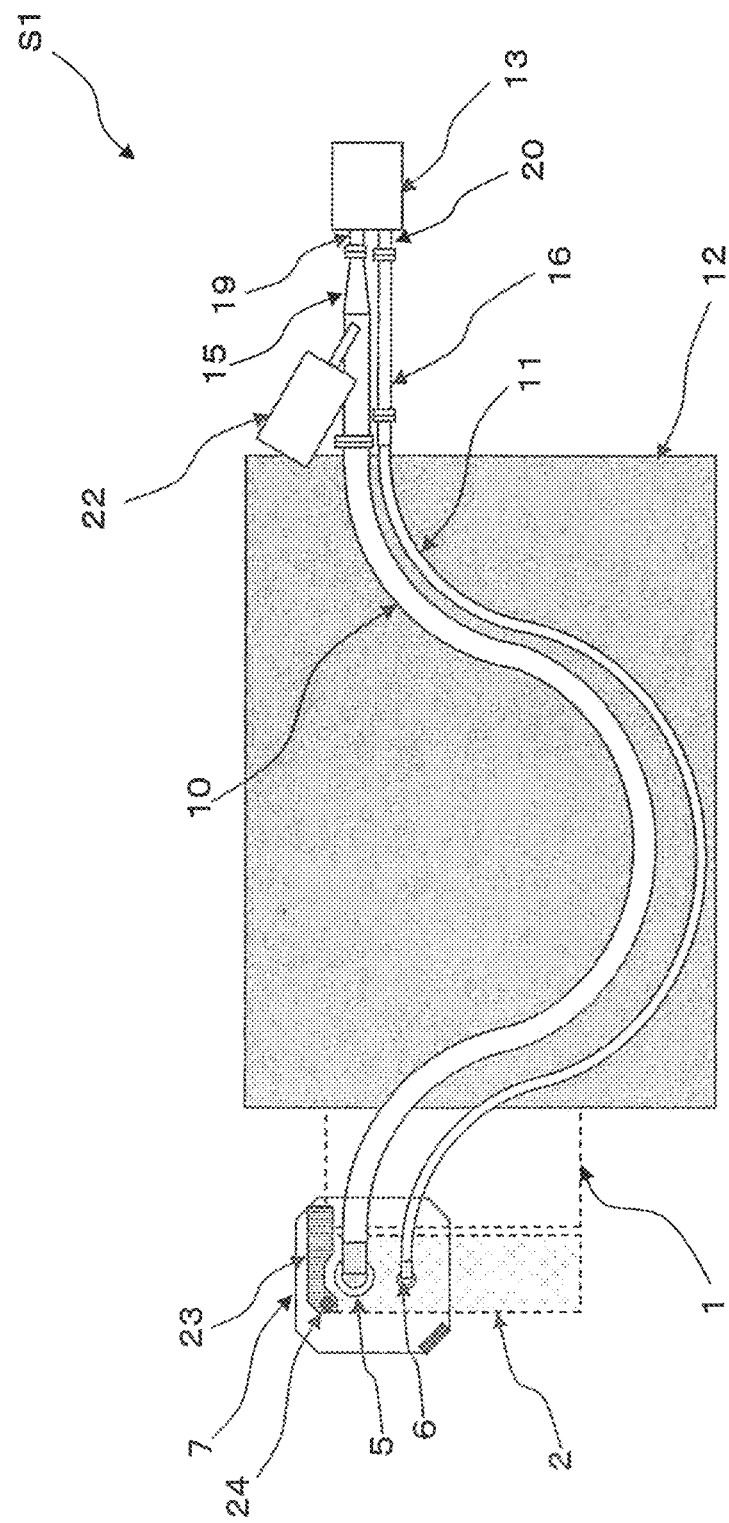
FIG. 2 is a top view showing the structure of the cooling system according to the first exemplary embodiment of the present invention.

FIG. 1 is a side view showing structure of a cooling system according to a first exemplary embodiment of the present invention. FIG. 2 is a top view showing the structure of the cooling system according to the first exemplary embodiment of the present invention. A cooling system S1 according to the first exemplary embodiment of the present invention includes an evaporator 3, refrigerant vapor pipes 5 and 15, refrigerant liquid pipes 6 and 16, flexible pipes 10 and 11, a tilting table 12, a heat exchanger 13, a pressure gauge 21 and a pressure regulator 22.

A server rack 1 which can store, for example, a rack mount type server computer (not described in the figure) is placed on a base-isolated floor 4. A back door 2 of the server rack 1 is fitted to the server rack 1 so as to be openable with a metal fitting 23 which has a rotation axis 24. The back door 2 stores the evaporator 3 and has a wheel 14.

The cooling system S1 carries out cooling with refrigerant. The evaporator 3 absorbs heat which the server rack 1 discharges by evaporating the refrigerant. The refrigerant (refrigerant vapor) which has become vapor by absorbing the heat moves to the heat exchanger 13 through the refrigerant vapor pipe 5, the flexible pipe 10 and the refrigerant vapor pipe 15. The heat exchanger 13 condenses the refrigerant vapor by cooling the refrigerant vapor. The refrigerant (refrigerant liquid) which has become liquid by the condensation moves to the evaporator 3 through the refrigerant liquid pipe 16, the flexible pipe 11 and the refrigerant liquid pipe 6. Then, the evaporator 3 recursively absorbs the heat which the server rack 1 discharges.

One end of the refrigerant vapor pipe 5 is connected with a pipe port 17 which is placed at an upper part of the evaporator 3, and part close to another end is fixed to a cart 7. Moreover, one end of the refrigerant liquid pipe 6 is connected with a pipe port 18 which is placed at an upper part of the evaporator 3, and part close to another end thereof is fixed to the cart 7. The cart 7 has wheels 8 which make it possible that the cart 7 moves in every direction on a ceiling 9 that is not base-isolated.

The tilting table 12 is placed on the ceiling 9. The tilting table 12 has a tilting surface which becomes higher as approaching from one end of the tilting surface to another end as an upper surface of the tilting table 12.

One end of the refrigerant vapor pipe 15 is connected with a pipe port 19 which the heat exchanger 13 has, and one end of the refrigerant liquid pipe 16 is connected with a pipe port 20 which the heat exchanger 13 has.

One end of the flexible pipe 10 is connected with the refrigerant vapor pipe 5, and another end is connected with the refrigerant vapor pipe 15. Moreover, one end of the flexible pipe 11 is connected with the refrigerant liquid pipe 6, and another end is connected with the refrigerant liquid pipe 16. Here, the flexible pipe 10 which can bend freely connects the refrigerant vapor pipe 5 and the refrigerant vapor pipe 15 not through the shortest path but with having an excess length so as to have a bent portion, and similarly, the flexible pipe 11 which can bend freely connects the refrigerant liquid pipe 6 and the refrigerant liquid pipe 16 not through the shortest path but with having an excess length so as to have a bent portion.

The flexible pipe 10 is placed on the tilting table 12 so as to become higher as approaching from a side of the flexible pipe 10 which is connected with the refrigerant vapor pipe 5 to a side which is connected with the refrigerant vapor pipe 15. Similarly, the flexible pipe 11 is placed on the tilting table 12 so as to become higher as approaching from a side of the flexible pipe 11 which is connected with the refrigerant liquid pipe 6 to a side which is connected with the refrigerant liquid pipe 16.

The pipe ports 19 and 20 of the heat exchanger 13 are placed higher than the pipe ports 17 and 18 respectively.

By virtue of the above-mentioned structure, the flow path of the refrigerant vapor from the evaporator 3 to the heat exchanger 13 through the refrigerant vapor pipe 5, the flexible pipe 10 and the refrigerant vapor pipe 15 is kept at a normal inclination (ascending inclination) and includes no reverse inclination part along the way. Similarly, the flow path of the refrigerant liquid from the heat exchanger 13 to the evaporator 3 through the refrigerant liquid pipe 16, the flexible pipe 11 and the refrigerant liquid pipe 6 is kept at a normal inclination (descending inclination) and includes no reverse inclination part along the way.

The pressure gauge 21 measures pressure (air pressure) inside the pipe. That is, the pressure gauge 21 measures pressure of the refrigerant vapor. The pressure gauge 21 may be a mechanical type or an electronic type. The pressure gauge 21 may have a function of outputting a measured value of the pressure as an electric signal.

The pressure regulator 22 regulates the pressure inside the pipe so as to be within a prescribed range. The pressure regulator 22 may be a vacuum pump or an on-off valve. The prescribed range may be, for example, the saturated vapor pressure and its vicinity. By maintaining the pressure inside the pipe to be the saturated vapor pressure and its vicinity, it is possible to prevent degradation of cooling efficiency of the cooling system S1.

The pressure regulator 22 may automatically regulate the pressure inside the pipe based on the pressure value which is indicated by the pressure gauge 21. For example, in the case that the pressure gauge 21 indicates that the pressure inside the pipe is higher than a prescribed pressure, the pressure regulator 22 may lower the pressure inside the pipe.

Figure 3:
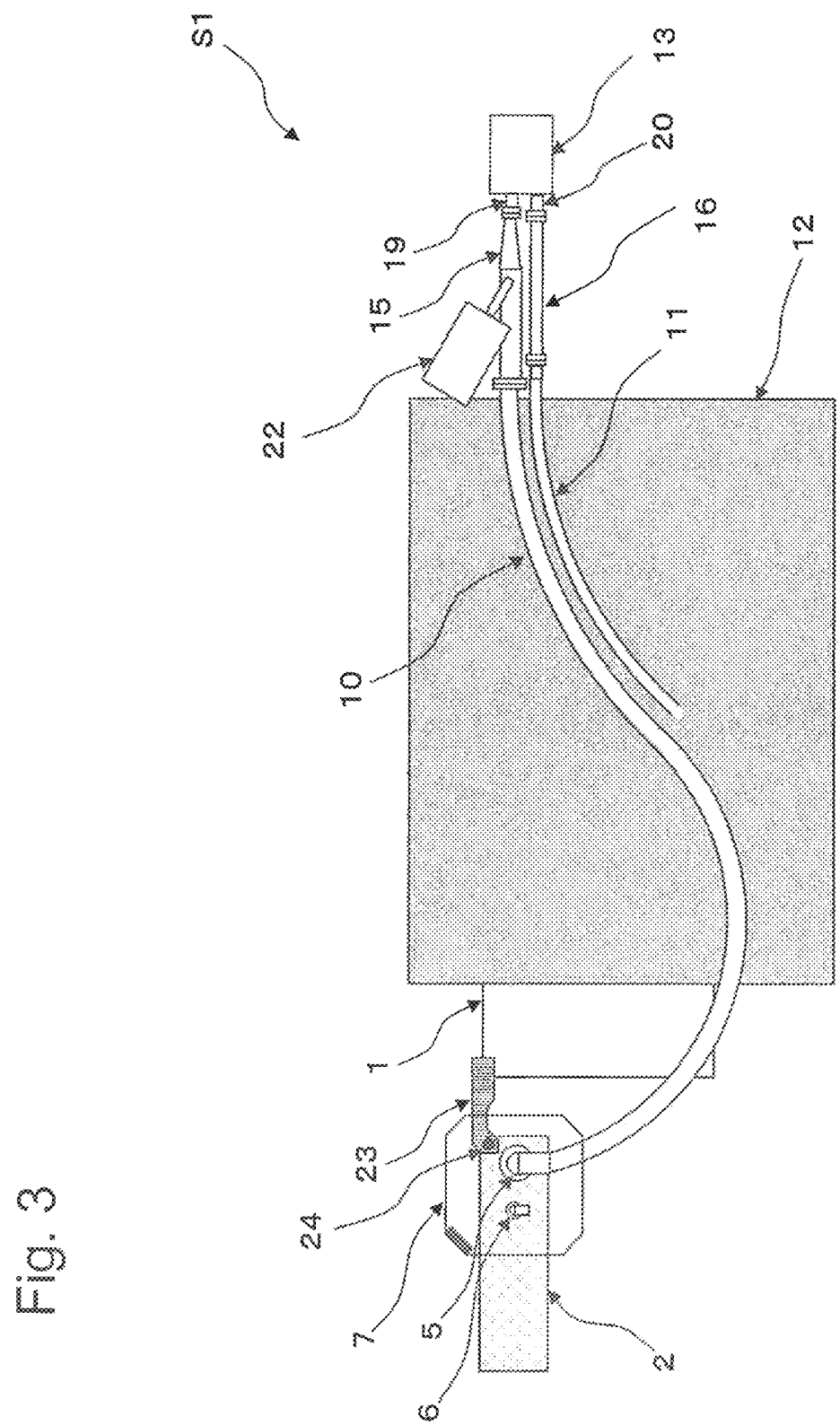
FIG. 3 is a top view showing a state that a back door 2 is open.

FIG. 3 is a top view showing a state that the back door 2 is open. Hereinafter, an operation which is carried out at a time when the back door 2 is opened and shut will be explained with reference to FIGS. 2 and 3.

It is possible to open and shut the back door 2 by rotating the back door 2 on the rotation axis 24. With opening and shutting the back door 2, the refrigerant vapor pipe 5 and the refrigerant liquid pipe 6 change their positions. These changes in positions are absorbed by allowing the flexible pipes 10 and 11 to curve and stretch (that is, bending) due to the excess lengths and flexibility of the flexible pipes 10 and 11. By virtue of the above, it is possible to open and shut the back door 2 in a state that the connection between the evaporator 3 and the heat exchanger 13 through the pipe is maintained.

Since the refrigerant vapor pipe 5 and the refrigerant liquid pipe 6 are fixed to the cart 7 which has the wheel 8, the refrigerant vapor pipe 5 and the refrigerant liquid pipe 6 can rotate and move with no distortion even when he refrigerant vapor pipe 5 and the refrigerant liquid pipe 6 are moved in connection with opening and shutting the back door 2

Since the flexible pipes 10 and 11 are placed on the tilting table 12, the flexible pipes 10 and 11 can keep the normal inclination even when moving according to opening and shutting the back door 2.

Figure 4:
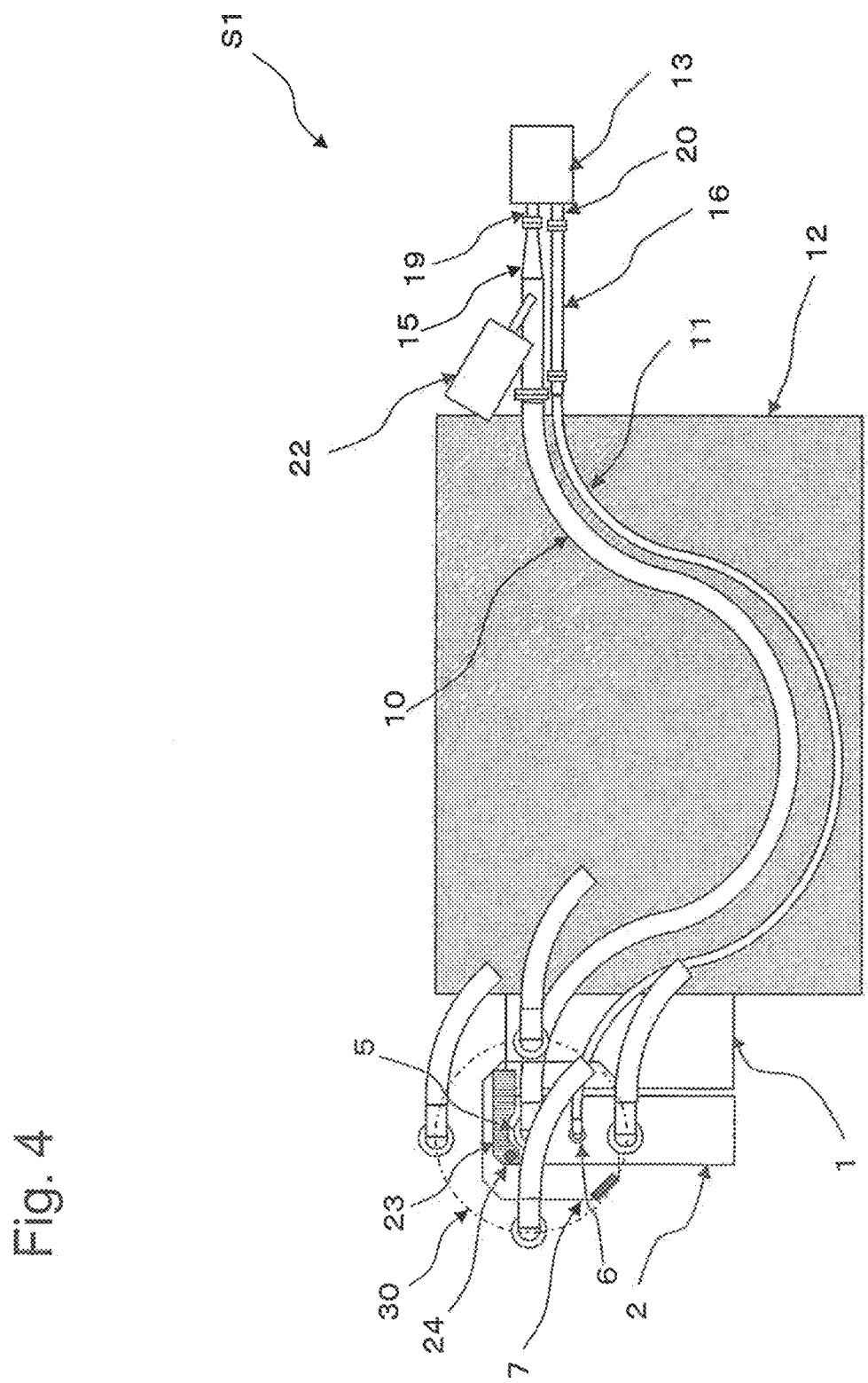
FIG. 4 is a top view showing a range in which the back door 2 moves in the event of an earthquake.

FIG. 4 is a top view showing a range in which the back door 2 moves in the event of an earthquake. Hereinafter, an operation which is carried out the event of an earthquake will be explained with reference to FIG. 4.

The base-isolated floor 4 eases a shock of the earthquake by a relative movement generated in response to vibration of the earthquake. Accordingly, in the event of the earthquake, the movement of the base-isolated floor 4 causes a displacement between the base-isolated floor 4 and the ceiling 9 which is not base-isolated. A movable range 30 described in FIG. 4 indicates a movable range of the base-isolated floor 4 which is relative to a position of the ceiling 9 and which is caused at the time when the earthquake occurs. At the time when the earthquake occurs, the cart 7 to which the refrigerant vapor pipe 5 and the refrigerant liquid pipe 6 are fixed can smoothly move on the ceiling 9 by the action of the wheels 8. At this time, by allowing the flexible pipes 10 and 11 to curve and stretch due to the excess lengths and flexibility of the flexible pipes 10 and 11 respectively, the change in distance between the base-isolated floor 4 and the ceiling 9 is absorbed. By virtue of the above, even when the earthquake occurs, it is possible to maintain the connection between the evaporator 3 and the heat exchanger 13 through the pipe.

Since the refrigerant vapor pipe 5 and the refrigerant liquid pipe 6 are fixed to the cart 7 which has the wheel 8, it is possible to prevent the occurrence of distortion even when an earthquake occurs.

Since the flexible pipes 10 and 11 are placed on the tilting table 12, it is possible to maintain their predetermined normal inclinations even when the flexible pipes 10 and 11 were moved due to the earthquake.

As mentioned above, the cooling system S1 according to the first exemplary embodiment of the present invention can prevent degradation of the cooling efficiency. The reason is that the flexible pipes 10 and 11 are placed on the tilting table 12 and consequently the flow path of the refrigerant is kept the normal inclination. In other words, it is because the absence of the reverse inclination in the refrigerant flow path prevents stagnation in the movement of the refrigerant.

Moreover, the cooling system S1 according to the first exemplary embodiment of the present invention makes it possible to open and shut the back door 2 in the state that the connection between the evaporator 3 and the heat exchanger 13 through the pipe is maintained. The reason is that the flexible pipes 10 and 11 can be curved and stretched due to the excess lengths and flexibility of the flexible pipes 10 and 11, respectively, and consequently the position change of the pipe which is caused at the time of opening or closing the back door 2 is absorbed while maintain the pipe connection.

Moreover, by the same reason, even when the earthquake occurs, the cooling system S1 according to the first exemplary embodiment of the present invention can maintain the connection between the evaporator 3 and the heat exchanger 13 through the pipe by absorbing the change in distance between the base-isolated floor 4 and the ceiling 9.

[Second Exemplary Embodiment]

Next, a second exemplary embodiment of the present invention will be explained. In the following explanation, structure which is the same as the structure of the first exemplary embodiment is assigned the same reference code, and explanation on the same structure is omitted.

Figure 5:
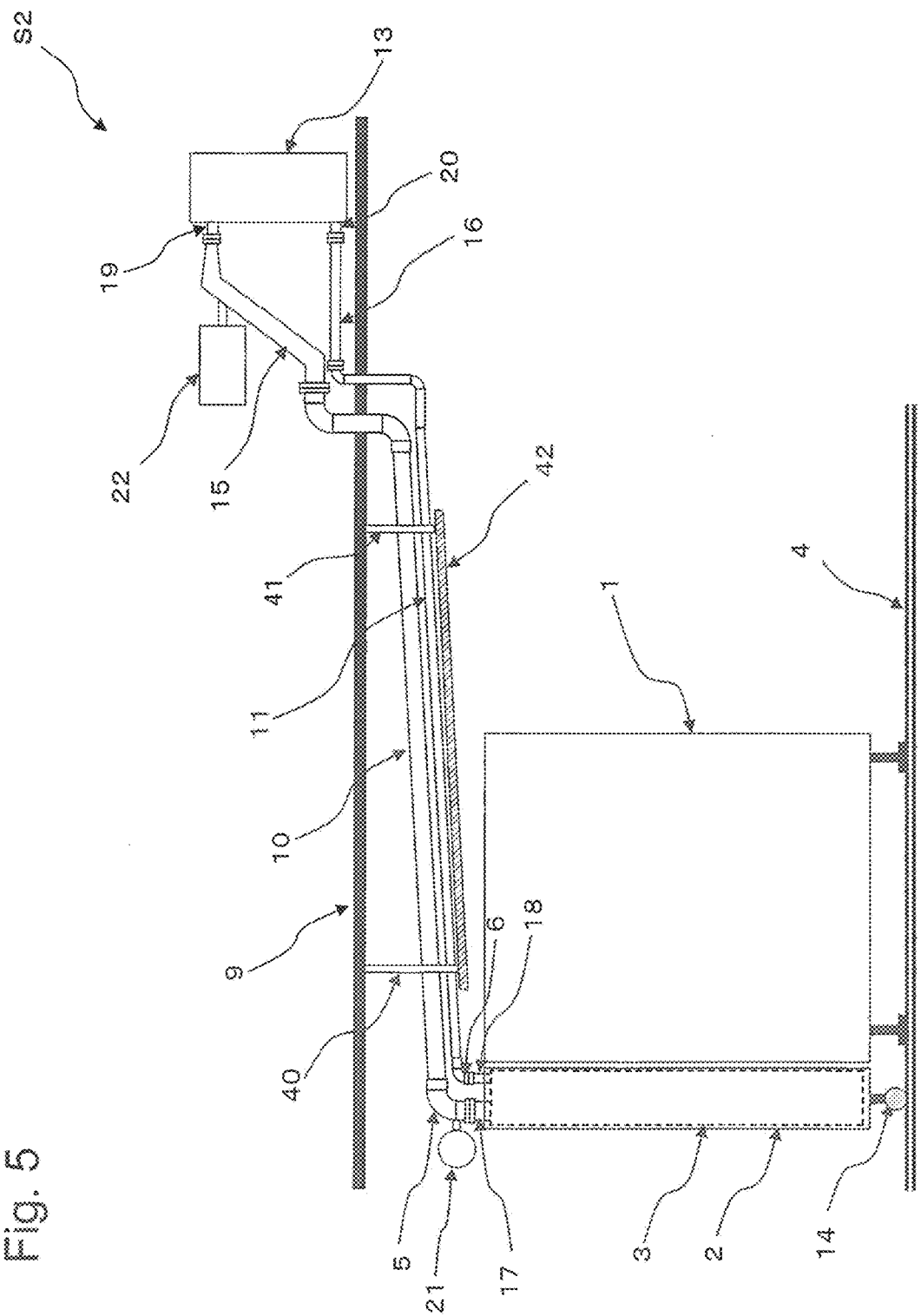
FIG. 5 is a side view showing structure of a cooling system according to a second exemplary embodiment of the present invention.

FIG. 5 is a side view showing structure of a cooling system according to the second exemplary embodiment of the present invention. A cooling system S2 according to the second exemplary embodiment of the present includes a tilting board 42 and supports 40 and 41 in place of the tilting table 12 described in FIG. 1. The tilting board 42 is hung from the ceiling 9 by the supports 40 and 41 in a tilting state that the tilting board 42 becomes higher as approaching from one end of the tilting board 42 to another end. Structure elements corresponding to the ones in the first exemplary embodiment except for the tilting board 42 and the supports 40 and 41 are assigned the same reference codes, and redundant explanations on the same structure elements are omitted.

Since each of the refrigerant vapor pipe 5 and the refrigerant liquid pipe 6 has a short length, the structure of the cooling system S2 described in FIG. 5 is effective in the case that there is a small possibility that the pipe is distorted due to movement.

Also the cooling system S2 according to the second exemplary embodiment of the present invention can bring about an advantage similar to the system S1 according to one of the first exemplary embodiment.

[Third Exemplary Embodiment]

Next, a third exemplary embodiment of the present invention will be explained.

FIG. 6 is a side view showing structure of a cooling system according to the third exemplary embodiment of the present invention. A cooling system S3 according to the third exemplary embodiment of the present invention includes the evaporator 3, the flexible pipe 10, the tilting table 12 and the heat exchanger 13.

The evaporator 3 is sometimes called a heat absorbing device. The flexible pipe 10 is sometimes called a first flexible pipe. The tilting table 12 is sometimes called a loading table. The heat exchanger 13 is sometimes called a radiator.

The evaporator 3 absorbs heat which is discharged from the server rack 1 with refrigerant. The server rack 1 may be other equipment.

The evaporator 3 has the pipe port 17. The pipe port 17 is sometimes called a first pipe port.

The heat exchanger 13 cools the refrigerant. The heat exchanger 13 has the pipe port 19. The pipe port 19 is placed higher than the pipe port 17. The pipe port 19 is sometimes called a second pipe port.

The flexible pipe 10 is connected with the pipe port 17 and the pipe port 19. The flexible pipe 10 can bend freely, and works as a path through which the refrigerant flows.

The tilting table 12 has a surface which becomes higher as approaching from one end of the surface to another end. The flexible pipe 10 is placed onto the surface so as to become higher as approaching from a side of the flexible pipe 10 which is connected with the pipe port 17 to a side which is connected with the pipe port 19.

As mentioned above, the cooling system S3 according to the third exemplary embodiment of the present invention can prevent degradation of the cooling efficiency. The reason is that the flexible pipe 10 is placed on the tilting table 12 and consequently the flow path of the refrigerant is kept the normal inclination. That is, the reason is that the flow path of the refrigerant has no reverse inclination, and consequently stagnation of the refrigerant is prevented.

The heat exchanger 13 in the first to the third exemplary embodiments may be a cooling tower of an air cooling type or a water cooling type. Alternatively, the heat exchanger may be a heat exchanger which carries out cooling with refrigerant other than the refrigerant used in the cooling systems S1 to S3.

The server rack 1 in the exemplary embodiments 1 to 3 may be electronic equipment other than the server rack 1. Here, while the first to the third exemplary embodiments describe the example that each of the two flexible pipes 10 and 11 has the normal inclination, the present invention is not limited to the example. For example, the flexible pipe 10 which is connected with the refrigerant vapor pipes 5 and 15 may have the normal inclination, and the flexible pipe 11 which is connected with the refrigerant liquid pipes 6 and 16 may be in a horizontal position. Moreover, while the number of the flexible pipes 10 and 11 is two in the first to the third exemplary embodiments, the number may be one. In this case, it is necessary that the flexible pipe has a diameter that enables the separation of the refrigerant liquid and the refrigerant vapor within the pipe due to the gravity, and it is necessary to place a joining unit, which joins the refrigerant liquid and the refrigerant vapor together, at one end of the flexible pipe, and a separation unit, which separates the refrigerant liquid and the refrigerant vapor, at another end.

Moreover, while the tilting board 42 is hung from the ceiling 9 by the supports 40 and 41 in the second exemplary embodiment, the tilting board 42 may be hung from another object. That is, the tilting board 42 may be hung from another surface, another member or another structure.

Hereinbefore, the present invention has been explained by exemplifying the above-mentioned exemplary embodiments as an exemplary example. However, the present invention is not limited to the above-mentioned exemplary embodiments. That is, the present invention can apply in various aspects, which a person skilled in the art can understand, within the scope of the present invention.

This application is based upon and claims the benefit of priority from Japanese Patent Application No. 2013-267091, filed on Dec. 25, 2013, the disclosure of which is incorporated herein in its entirety by reference.

INDUSTRIAL CAPABILITY

The present invention can apply to a cooling apparatus using the boiling and cooling method that heat transportation and radiation are carried out by a cycle of evaporation and condensation of the refrigerant.

REFERENCE SIGNS LIST

S1, S2 and S3 cooling system
1 server rack
2 back door
3 evaporator
4 base-isolated floor
5 and 15 refrigerant vapor pipe
6 and 16 refrigerant liquid pipe
7 cart
8 and 14 wheel
9 ceiling
10 and 11 flexible pipe
12 tilting table
13 heat exchanger
17, 18, 19 and 20 pipe port
21 pressure gauge
22 pressure regulator
23 metal fitting
24 rotation axis
30 movable range
40 and 41 support
42 tilting board

The invention claimed is:

1. A cooling system comprising:
a heat absorbing device which has a first pipe port and absorbs heat discharged from equipment by using refrigerant;
a radiator which has a second pipe port placed higher than the first pipe port and cools the refrigerant;
a first flexible pipe that is bendable and serves as a flow path of the refrigerant, the first flexible pipe being connected to the first pipe port at one end and the second pipe port at another end; and
a loading table having a surface that rises in a vertical direction as a corresponding position onto the surface approaches from one end of the surface to another end, the surface supporting the first flexible pipe placed thereon in such a way that the first flexible pipe rises in the vertical direction as a corresponding position on the first flexible pipe approaches from a side connected to the first pipe port to a side connected to the second pipe port.

2. The cooling system according to claim 1, further comprising:
a second flexible pipe that is bendable and serves as a flow path of the refrigerant, wherein
the heat absorbing device further includes a third pipe port and absorbs the heat discharged from the equipment by evaporating the refrigerant, wherein
the radiator further includes a fourth pipe port, which is placed higher than the third pipe port, and condenses the evaporated refrigerant by cooling the evaporated refrigerant, wherein
the second flexible pipe is connected to the third pipe port at one end and the fourth pipe port at another end, wherein
the loading table has the surface supporting the second flexible pipe placed thereon in such a way that the second flexible pipe rises in the vertical direction as a corresponding position on the second flexible pipe approaches from a side connected to the third pipe port to a side connected to the fourth pipe port, wherein
the first flexible pipe is a path through which the refrigerant evaporated by the heat absorbing device is conveyed to the radiator, and wherein
the second flexible pipe is a path through which the refrigerant condensed by the radiator is conveyed to the heat absorbing device.

3. The cooling system according to claim 1, wherein
each of the first and the second flexible pipes has a bent portion when being placed on the loading table and bends freely in response to a movement of the heat absorbing device.

4. The cooling system according to claim 1, further comprising:
a cart to which one end of each of the first and the second flexible pipes is fixed, the cart being movable in response to a movement of the heat absorbing device.

5. The cooling system according to claim 1, wherein
the loading table is placed onto a surface which is positioned higher than the heat absorbing device.

6. The cooling system according to claim 1, wherein
the loading table is hung from a place higher than a place of the heat absorbing device.

7. The cooling system according to claim 2, further comprising:
a pressure gauge which measures pressure of the evaporated refrigerant; and
a pressure regulator which regulates the pressure based on the pressure measured so as to be in a prescribed state.

8. Electronic equipment, comprising:
the cooling system according to claim 1.

* * * * *